United States Patent
Toshima et al.

(10) Patent No.: US 11,387,131 B2
(45) Date of Patent: Jul. 12, 2022

(54) ALIGNMENT APPARATUS AND METHOD OF MANUFACTURING SEMICONDUCTOR DEVICE

(71) Applicant: Kioxia Corporation, Minato-ku (JP)

(72) Inventors: Miki Toshima, Yokohama (JP); Osamu Yamane, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 140 days.

(21) Appl. No.: 16/810,945

(22) Filed: Mar. 6, 2020

(65) Prior Publication Data

US 2021/0043488 A1 Feb. 11, 2021

(30) Foreign Application Priority Data

Aug. 6, 2019 (JP) .............................. JP2019-144962

(51) Int. Cl.
*H01L 25/065* (2006.01)
*H01L 23/544* (2006.01)
(Continued)

(52) U.S. Cl.
CPC .......... *H01L 21/681* (2013.01); *G06V 10/225* (2022.01); *H01L 22/20* (2013.01); *H01L 23/544* (2013.01); *H01L 24/08* (2013.01); *H01L 24/80* (2013.01); *H01L 25/0657* (2013.01); *H01L 25/18* (2013.01); *H01L 25/50* (2013.01); *G06V 2201/06* (2022.01); *H01L 2223/54426* (2013.01); *H01L 2224/0224* (2013.01); *H01L 2224/08145* (2013.01);
(Continued)

(58) Field of Classification Search
CPC ............... H01L 23/544; H01L 25/0657; H01L 2224/8013
See application file for complete search history.

(56) References Cited

U.S. PATENT DOCUMENTS 6,937,344 B2    8/2005   Monshouwer et al.
9,851,645 B2 * 12/2017   Wagenleitner .......... H01L 22/26
(Continued)

FOREIGN PATENT DOCUMENTS

JP     2004-517477 A    6/2004
JP     2010-087377 A    4/2010
(Continued)

*Primary Examiner* — Dale E Page
*Assistant Examiner* — Wilner Jean Baptiste
(74) *Attorney, Agent, or Firm* — Oblon, McClelland, Maier & Neustadt, L.L.P.

(57) ABSTRACT

An alignment apparatus according to one embodiment, includes: a first and a second stage; a first and a second detector; a first and a second moving mechanism; and a controller. The first and second stages are configured to respectively hold a first and a second semiconductor substrate on which a first and a second alignment mark are respectively disposed. The first and second moving mechanisms are configured to respectively move the first and second stages relatively to each other. The controller is configured to perform the following (a), (b). (a) The controller control the detectors and the moving mechanisms to cause the first detector to detect the second alignment mark and to cause the second detector to detect the first alignment mark. (b) The controller calculate a position deviation between the substrates in accordance with results of the detections.

13 Claims, 9 Drawing Sheets

(51) Int. Cl.
*H01L 21/68* (2006.01)
*H01L 25/00* (2006.01)
*H01L 25/18* (2006.01)
*H01L 21/66* (2006.01)
*H01L 23/00* (2006.01)
*G06V 10/22* (2022.01)

(52) U.S. Cl.
CPC .............. *H01L 2224/8013* (2013.01); *H01L 2224/80895* (2013.01); *H01L 2224/80896* (2013.01); *H01L 2225/06524* (2013.01); *H01L 2225/06593* (2013.01); *H01L 2924/1431* (2013.01); *H01L 2924/1434* (2013.01)

(56) References Cited

U.S. PATENT DOCUMENTS

2005/0201670 A1* 9/2005 Uchiyama .............. H05K 3/361
                                                        385/88
2011/0186853 A1  8/2011 Terai et al.
2019/0148184 A1* 5/2019 Sugaya ............. H01L 21/67288
                                                        438/455

FOREIGN PATENT DOCUMENTS

| JP | 2011-159908 A | 8/2011 |
|----|---------------|--------|
| JP | 2016-503589 A | 2/2016 |
| WO | WO 2018/012300 A1 | 1/2018 |

* cited by examiner

ALIGNMENT APPARATUS AND METHOD OF MANUFACTURING SEMICONDUCTOR DEVICE

CROSS-REFERENCE TO RELATED APPLICATION

This application is based upon and claims the benefit of priority from Japanese Patent Application No. 2019-144962, filed on Aug. 6, 2019; the entire contents of which are incorporated herein by reference.

FIELD

Embodiments described herein relate generally to an alignment apparatus, and a method of manufacturing a semiconductor device.

BACKGROUND

A semiconductor device can be manufactured by bonding a plurality of semiconductor substrates. This manufacture includes positioning (aligning) the semiconductor substrates before the bonding.

For this purpose, alignment marks are disposed on the semiconductor substrates, and positions of the alignment marks are checked using a imaging device such as a camera.

The alignment and the check, however, are complicated and inefficient to every semiconductor substrate.

DETAILED DESCRIPTION

Figure 1:
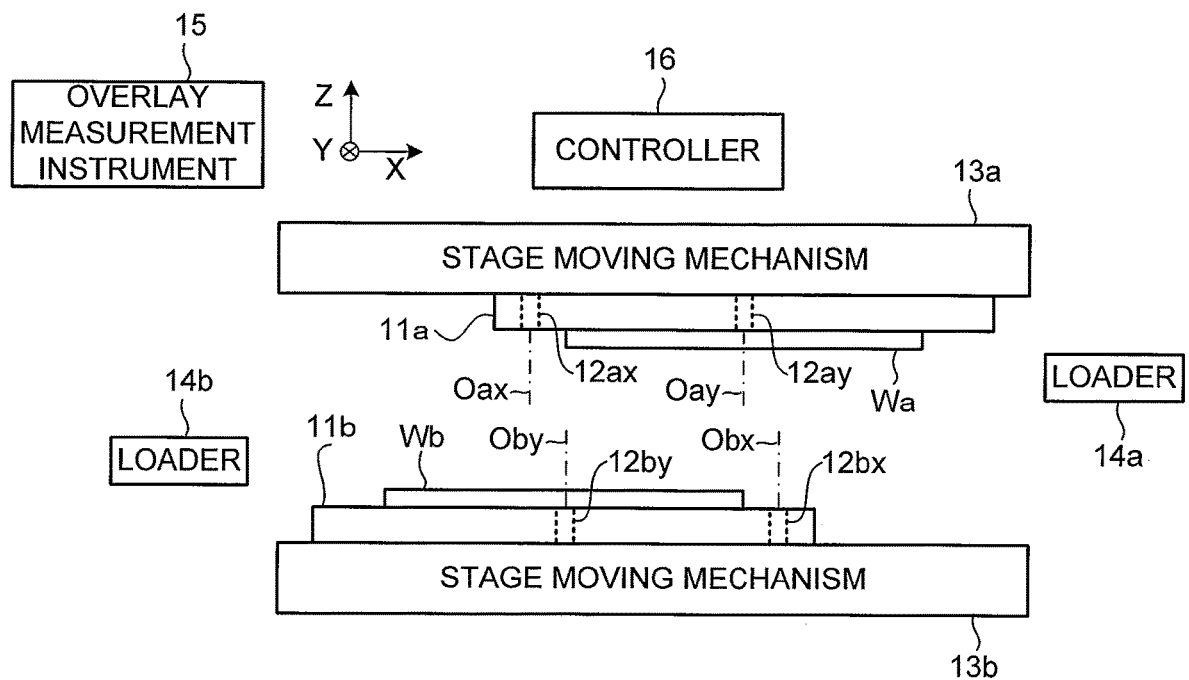
FIG. 1 is a block diagram schematically showing an alignment apparatus according to an embodiment.

An alignment apparatus according to one embodiment, includes: a first and a second stage configured to respectively hold a first and a second semiconductor substrate on which a first and a second alignment mark are respectively disposed; a first and a second detector respectively disposed on the first and second stages; a first and a second moving mechanism configured to respectively move the first and second stages relatively to each other; and a controller configured to: control the first and second detectors and the first and second moving mechanisms to cause the first detector to detect the second alignment mark and to cause the second detector to detect the first alignment mark; and calculate a position deviation between the first and second semiconductor substrates in accordance with results of the detections.

Hereinafter, an embodiment of the present invention will be explained while referring to the drawings.

FIG. 1 shows a semiconductor wafer alignment apparatus according to the embodiment. The apparatus comprises stages 11 (11a, 11b), detectors 12 (12ax, 12ay, 12bx, 12by), stage moving mechanisms 13 (13a, 13b), loaders 14 (14a, 14b), an overlay measurement instrument 15, and a controller 16.

The stages 11 (11a, 11b) are first and second stages configured to respectively hold semiconductor wafers W (Wa, Wb). The stages 11a, 11b are disposed above and below (in Z-axis positive direction and negative direction) to hold the semiconductor wafers Wa, Wb. The stage 11a holds the semiconductor wafer Wa on its bottom surface, and the stage 11b holds the semiconductor wafer Wb on its top surface.

The stages 11a, 11b have suction mechanisms (not illustrated) which suck and hold the semiconductor wafers Wa, Wb, and can hold the semiconductor wafers Wa, Wb in a state of fixing them even when the semiconductor wafers Wa, Wb are held on the bottom surfaces, or moved by the stage moving mechanisms 13.

Figure 2:
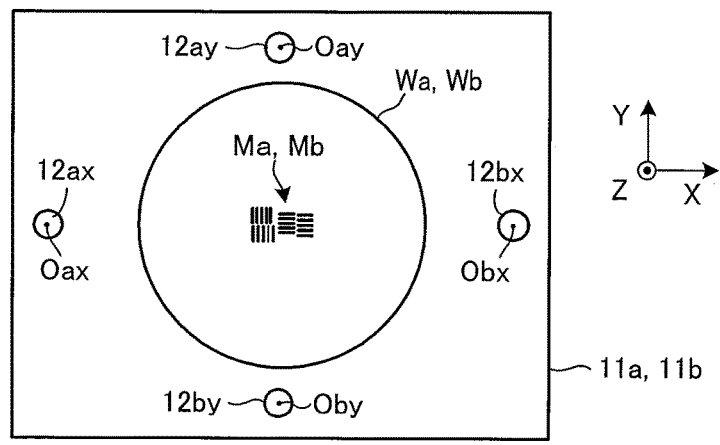
FIG. 2 is a diagram schematically showing stages overlapping each other above and below.

FIG. 2 schematically shows a state where the stages 11a, 11b are disposed above and below and seen from above. The stage 11a, the semiconductor wafer Wa, the semiconductor wafer Wb, and the stage 11b are disposed in a Z-axis direction. When seen from above the stage 11a, the semiconductor wafers Wa, Wb, and the like are hidden therebehind not to be seen actually, but the illustration is made assuming that the semiconductor wafers Wa, Wb and the detectors 12 (12ax, 12ay, 12bx, 12by) are seen through the stages 11a, 11b.

Contours of the stages 11a, 11b correspond to each other and contours of the semiconductor wafers Wa, Wb correspond to each other. Here, for easier understanding, FIG. 2 illustrates that the stages 11a, 11b have the same size and the semiconductor wafers Wa, Wb have the same size, and the stages and the semiconductor wafers are in a state of overlapping each other above and below without position deviations in X-axis and Y-axis directions. However, the stages 11a, 11b need not have the same size.

The semiconductor wafers Wa, Wb are each a substrate consisting of a semiconductor such as silicon and a structure of a semiconductor device such as a memory cell array or a control circuit is formed thereon.

Alignment marks M (Ma, Mb) for positioning are respectively formed on the semiconductor wafers Wa, Wb.

Figure 3:
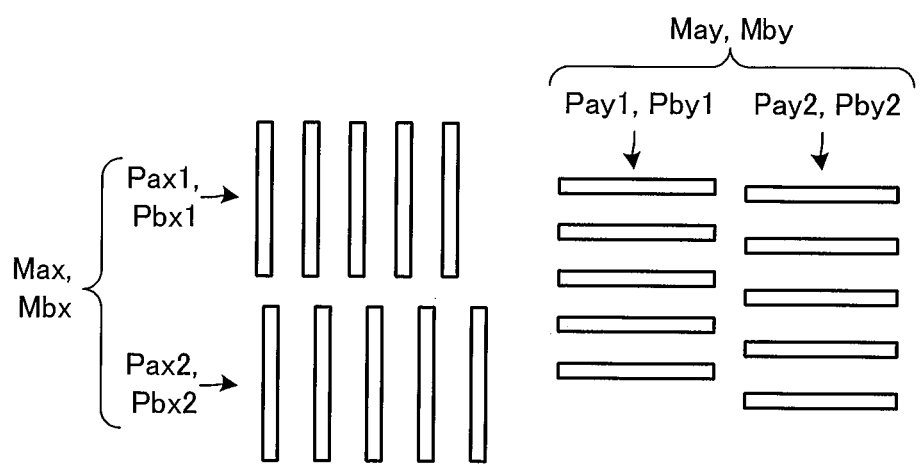
FIG. 3 is a diagram illustrating one example of alignment marks.

FIG. 3 shows a state of enlarging the alignment marks Ma, Mb (first and second alignment marks).

The alignment mark Ma is disposed on the bottom surface of the semiconductor wafer Wa, and the alignment mark Mb is disposed on the top surface of the semiconductor wafer Wb. That is, the alignment marks Ma, Mb are disposed on the semiconductor wafers Wa, Wb facing each other.

The alignment marks Ma, Mb are disposed on a dicing line being a boundary area between chips when the semiconductor wafers Wa, Wb are separated into pieces of chips, for example.

Here, the alignment marks M are disposed in the vicinity of the center of the semiconductor wafers W, but may deviate from the center of the semiconductor wafers W.

Besides, here, each of the alignment marks Ma, Mb is disposed at one position, but each of the alignment marks can be disposed at a plurality of positions, in each of the semiconductor wafers Wa, Wb.

The alignment marks Ma, Mb overlap each other above and below. That is, the alignment marks Ma, Mb face each other, and their shapes are in the relation of mirror images to each other.

The alignment mark Ma (Mb) can be divided into marks Max, May (Mbx, Mby).

The marks Max (Mbx) and May (Mby) are used for the positionings in the X-axis direction and the Y-axis direction respectively.

The mark Max (Mbx) has patterns Pax1, Pax2 (Pbx1, Pbx2) arranged in parallel with each other in the Y direction.

Each of the patterns Pax1, Pax2 (Pbx1, Pbx2) is patterns of L (line) & S (space) lined up in the X direction.

That is, a plurality of line patterns are arranged along the X-axis direction while each having substantially the same interval (pitch). The pitches are different between the patterns Pax1 and Pax2 (between Pbx1 and Pbx2).

Here, the pitch of the patterns Pax2 is set to be larger than the pitch of the patterns Pax1, and the pitch of the patterns Pbx2 is set to be larger than the pitch of the patterns Pbx1. However, the magnitude relation of the pitches can be inverted.

The patterns Pax1 correspond to a first patterns arranged at a first pitch, and the patterns Pax2 correspond to a second patterns arranged at a second pitch different from the first pitch.

The patterns Pbx1 correspond to a third patterns arranged at a third pitch, and the patterns Pbx2 correspond to a fourth patterns arranged at a fourth pitch different from the third pitch.

These first to fourth patterns can be formed by the line patterns, also can be alternatively formed by the other patterns.

The third pitch can be substantially equal to the first pitch, and the fourth pitch can be substantially equal to the second pitch.

As described later, a position where the line patterns in the patterns Pax1, Pax2 or Pbx1, Pbx2 correspond to each other in the Y-axis direction is an alignment target (alignment position) Tax or Tbx in the X-axis direction.

Further, a position where lines of L & S patterns Pay1, Pay2 (Pby1, Pby2) included in the mark May (Mby) and disposed in parallel with each other in the X direction correspond to each other is an alignment target (alignment position) Tay (or Tby) in the Y-axis direction.

As long as X coordinates of the alignment positions Tax, Tbx coincide with each other, the positioning of the semiconductor wafers Wa, Wb in the X direction can be considered to be achieved. Further, as long as Y coordinates of the alignment positions Tay, Tby coincide with each other, the positioning of the semiconductor wafers Wa, Wb in the Y direction can be considered to be achieved.

In the alignment marks M, the position where the lines of the patterns Pax1, Pax2 correspond to each other need not be directly indicated. For example, if the patterns Pax1, Pax2 are extended virtually in the X-axis direction and the lines correspond to each other in a certain position, the position is adoptable as the alignment target.

Examples of each of the detectors 12 (12ax, 12ay, 12bx, 12by) include an optical imaging device such as a charge coupled device (CCD), and can read (detect) the alignment marks M (Ma, Mb).

As illustrated in FIG. 1 and FIG. 2, the detectors 12ax, 12ay, 12bx, 12by are disposed in the stages 11a, 11b.

The detectors 12ax, 12bx are respectively disposed in the stages 11a, 11b, and used for the positioning in the X-axis direction.

The detector 12ax is disposed on an X-axis negative direction side on the bottom surface of the stage 11a, and the detector 12bx is disposed on an X-axis positive direction side on the top surface of the stage 11b. That is, the detectors 12ax, 12bx are disposed apart from each other in the X-axis direction when the positioning is performed on the stages 11a, 11b. As a result, as described later, it becomes easy to read the alignment marks Mb (particularly, Mbx), Ma (particularly, Max) simultaneously with the respective detectors 12ax, 12bx.

The detectors 12ay, 12by are respectively disposed in the stages 11a, 11b, and used for the positioning in the Y-axis direction.

The detectors 12ay, 12by are disposed on a Y-axis positive direction side on the bottom surface of the stage 11a, and on a Y-axis negative direction side on the top surface of the stage 11b respectively. The detectors 12ay, 12by are disposed apart from each other in the Y-axis direction when the positioning is performed on the stages 11a, 11b, and it becomes easy to read the alignment marks Mb (particularly, Mby), Ma (particularly, May) simultaneously with the respective detectors 12ay, 12by.

Here, the detectors 12ax, 12bx, 12ay, 12by are disposed in the vicinities of the middles of edges of the stages 11a, 11b. However, this is one example, and they can be apart from the edges, or may deviate from the middles of the edges.

The detectors 12 (12ax, 12bx, 12ay, 12by) respectively have virtual axes (center axes) O (Oax, Obx, Oay, Oby) each being a reference. The axes Oax, Obx each function as the reference (origin) of the X axis of each of the stages 11a, 11b, and the axes Oay, Oby each function as the reference (origin) of the Y axis of each of the stages 11a, 11b. As described later, axis alignment is performed with respect to the axes Oax, Obx (the axes Oay, Oby), which become the common reference of the X axis (Y axis) on the stage 11a (11b).

The stage moving mechanisms 13a, 13b function as moving mechanisms which move the stages 11a, 11b relatively to each other, and can move the stages 11a, 11b in triaxial (X, Y, Z axes) directions (movements in X, Y, Z directions) and can rotate them in the triaxial directions (for example, rotations at angles of $\theta$, $\phi$, $\varphi$). The rotation centering on the Z axis is set as the rotation in a $\varphi$ direction.

The loaders 14a, 14b correspond to load mechanisms which load the semiconductor wafers Wa, Wb on the stages 11a, 11b, and unload the semiconductor wafers Wa, Wb from the stages 11a, 11b respectively.

That is, the loaders 14a, 14b put the semiconductor wafers Wa, Wb on the bottom surface of the stage 11a, and on the top surface of the stage 11b respectively. The put semiconductor wafers Wa, Wb are sucked and fixed on the stages 11a, 11b.

The overlay measurement instrument 15 measures an overlapping state (overlay) of the bonded semiconductor wafers Wa, Wb. The above details are described later.

The controller 16 is includes, for example, a processor such as a CPU (Central Processing Unit), software, and a storage (memory), and is configured to control the stages 11 (11a, 11b), the detectors 12 (12ax, 12ay, 12bx, 12by), the stage moving mechanisms 13 (13a, 13b), the loaders 14 (14a, 14b), and the overlay measurement instrument 15.

The storage of the controller 16 stores position data of the axes Oax, Obx (Oay, Oby) and the alignment marks Ma, Mb or the alignment targets Tax, Tbx, Tay, Tby.

The position data can be set as temporary numerical values without consideration of the position deviations between the stages 11a and 11b, between the stage 11a and the semiconductor wafer Wa, and between the stage 11b and the semiconductor wafer Wb.

Concretely, the controller 16 controls them as follows. Here, an explanation is limited to a simplified one, and details are described later.

(a) Load of Semiconductor Wafers Wa, Wb (Step S11 Described Later)

The controller 16 controls the loaders 14 to load the semiconductor wafer Wa having the alignment mark Ma on the stage 11a, and to load the semiconductor wafer Wb having the alignment mark Mb on the stage 11b.

(b) Axis Alignment of Detectors 12Ax, 12Bx (Step S12 Described Later, FIG. 5)

The controller 16 controls the stage moving mechanisms 13 and the detectors 12 to match the axes Oax, Obx of the detectors 12ax, 12bx or the axes Oay, Oby of the detectors 12ay, 12by.

Thus, the matched axes Oax, Obx or axes Oay, Oby become the reference (origin) of the position on the X axis or the Y axis.

(c) Detection of Alignment Marks Ma, Mb (Step S13 Described Later, FIG. 6, FIG. 7)

The controller 16 controls the stage moving mechanisms 13 and the detectors 12 to move the detectors 12ax, 12bx or the detectors 12ay, 12by so as to face the alignment marks Mb, Ma, and the alignment marks are detected. That is, the detector 12ax or the detector 12ay detects the alignment mark Mb, and the detector 12bx or the detector 12by detects the alignment mark Ma.

For example, in accordance with a result of aligning the axes Oax, Obx, the stage 11a is moved so that the detector 12ax is at a position where the alignment mark Mb can be detected. Moving the stage 11a as described above allows the detector 12bx to be at a position where the alignment mark Ma can be detected.

At this time, a rotation angle φ of the semiconductor wafer Wa or the semiconductor wafer Wb is preferably corrected from an inclination of the patterns Pax1, Pax2 or Pbx1, Pbx2 with respect to the X axis.

(d) Calculation of Position Deviation Between Semiconductor Wafers Wa, Wb (Step S14 Described Later, FIG. 8)

The controller 16 calculates a position deviation Dx of the semiconductor wafers Wa, Wb in accordance with the detected alignment marks Ma, Mb by the next steps 1), 2), for example.

1) Calculation of Alignment Targets Tax and Tbx

First positions or second positions (alignment targets Tax or Tbx) where the patterns in the patterns Pax1, Pax2 or Pbx1, Pbx2 correspond to each other are calculated.

2) Calculation of Position Deviation Dx of Semiconductor Wafers Wa, Wb

In accordance with a later-described formula, the position deviation Dx of the semiconductor wafers Wa, Wb in the X-axis direction can be calculated.

Figure 8:
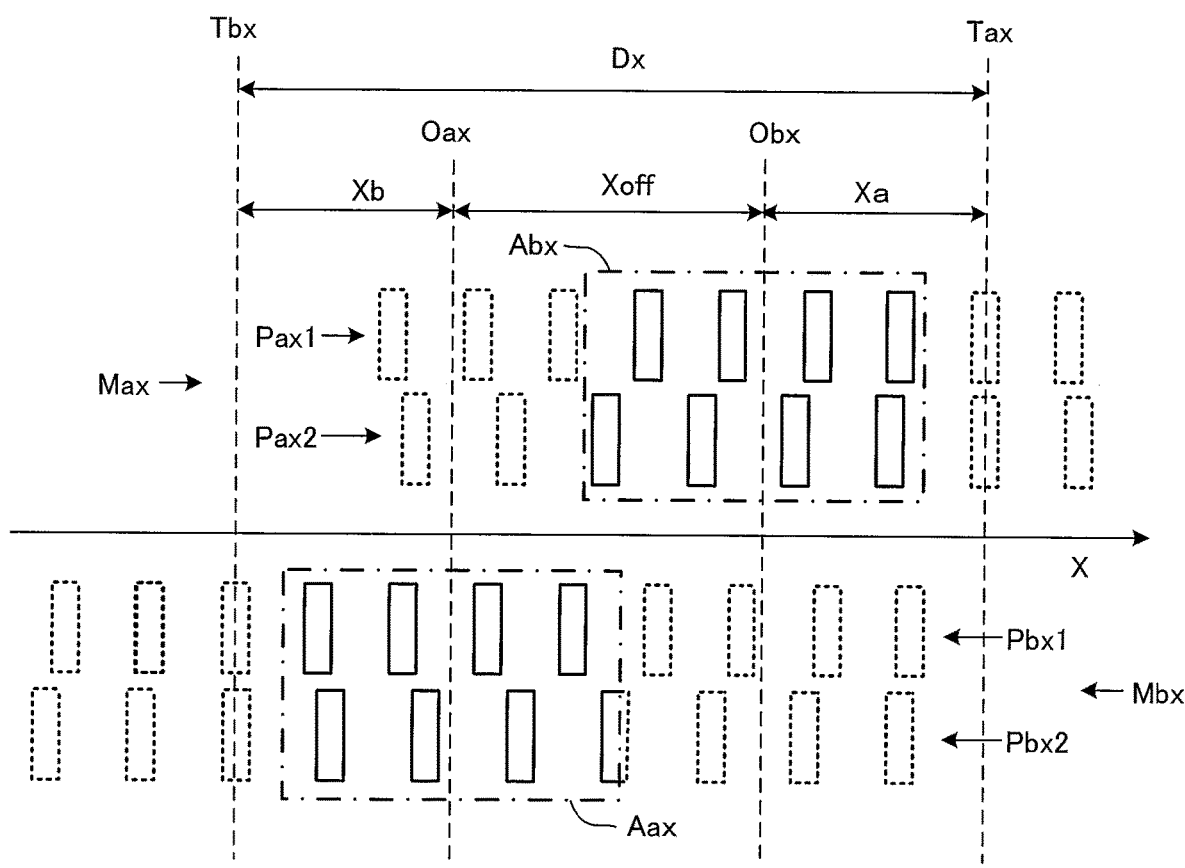
FIG. 8 is a schematic diagram showing one example of position deviation detection of semiconductor wafers.

In FIG. 8, for easier understanding, the marks Max, Mbx are shifted up and down. Actually, the marks Max, Mbx are in a state of substantially overlapping each other. This point is also similar to those in later-described FIG. 9 and FIG. 11.

(e) Positioning of Semiconductor Wafers Wa, Wb (Step S15 Described Later, FIG. 9)

The controller 16 controls the stage moving mechanisms 13 to move the semiconductor wafers Wa, Wb relatively to each other over the distance Dx.

In the above, the positioning in the X-axis direction is mainly explained, and similar positioning is possible also in the Y-axis direction.

(Manufacturing of a Semiconductor Device by Using a Semiconductor Wafer Alignment Apparatus)

Hereinafter, a method of manufacturing a semiconductor device using a semiconductor wafer alignment apparatus will be explained.

Figure 4:
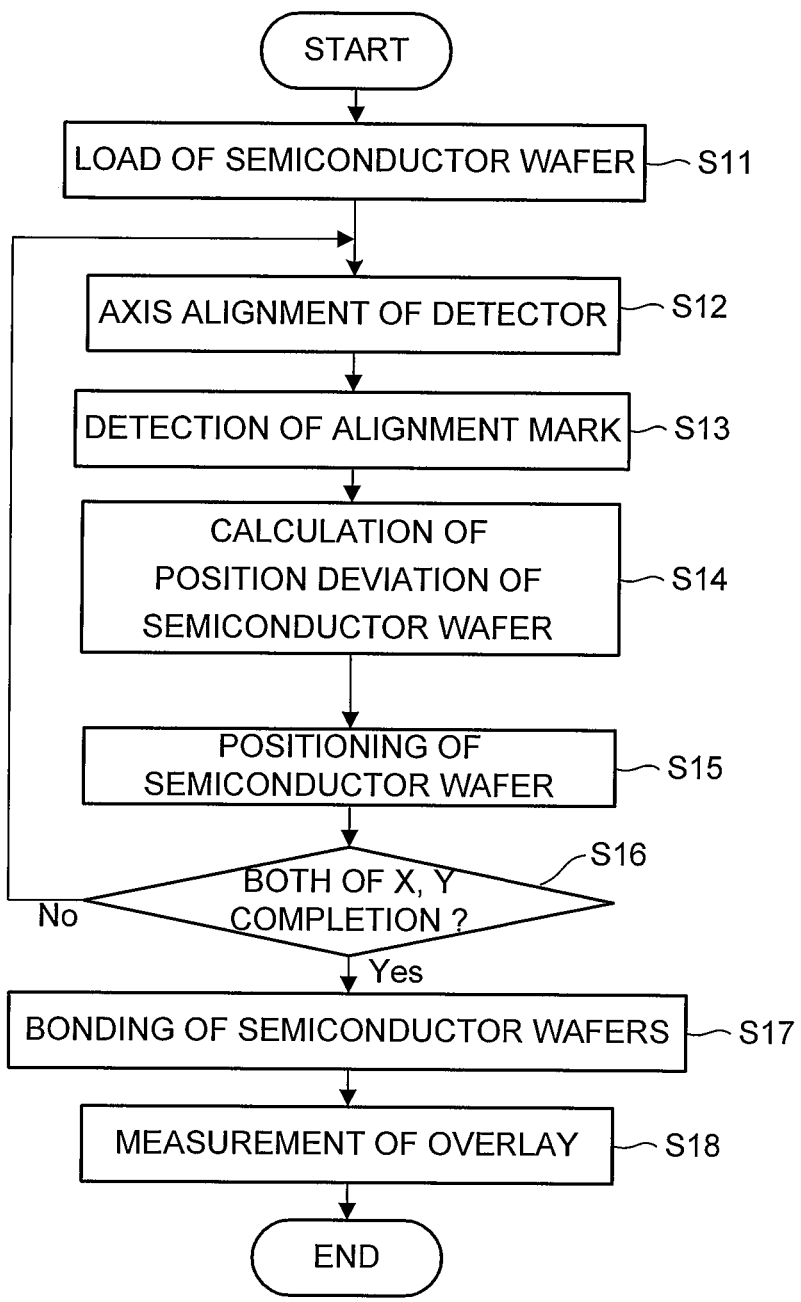
FIG. 4 is a flowchart showing one example of a manufacturing process of a semiconductor device.
Figure 12:
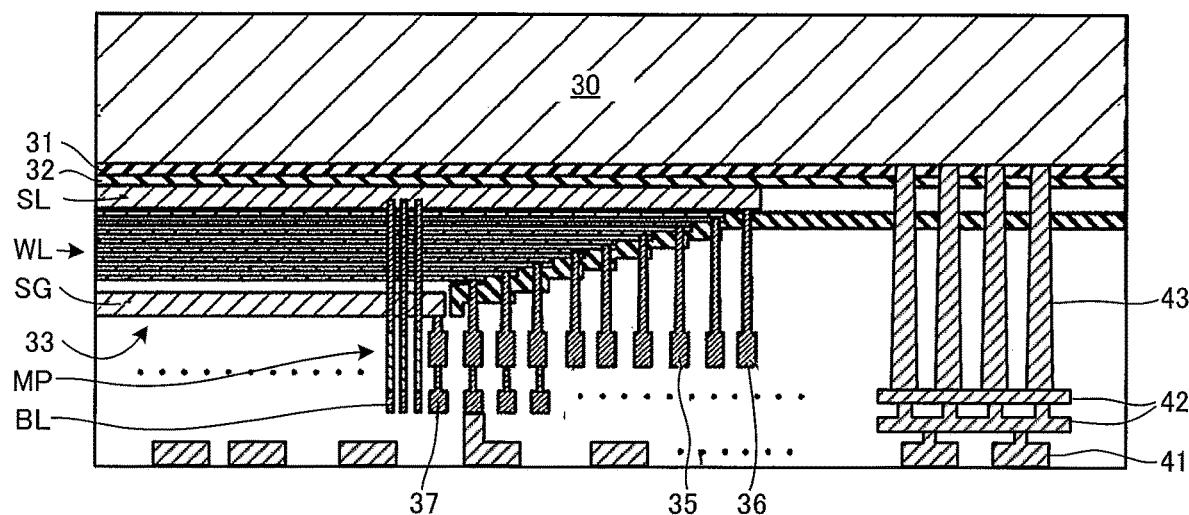
FIG. 12 is a sectional view schematically showing one example of a semiconductor wafer.
Figure 13:
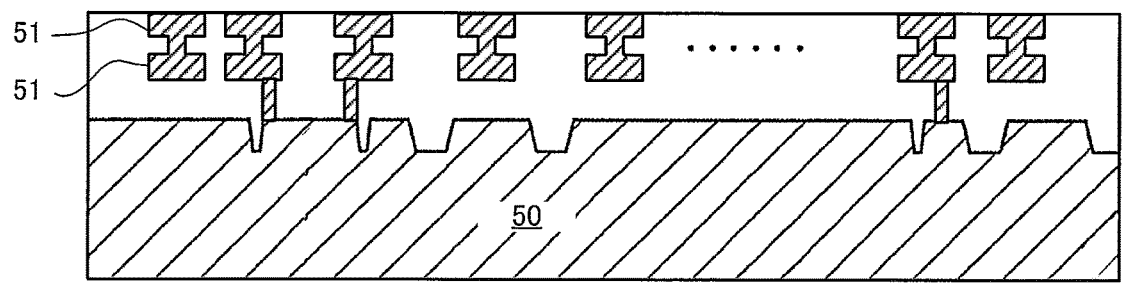
FIG. 13 is a sectional view schematically showing one example of a semiconductor wafer.
Figure 14:
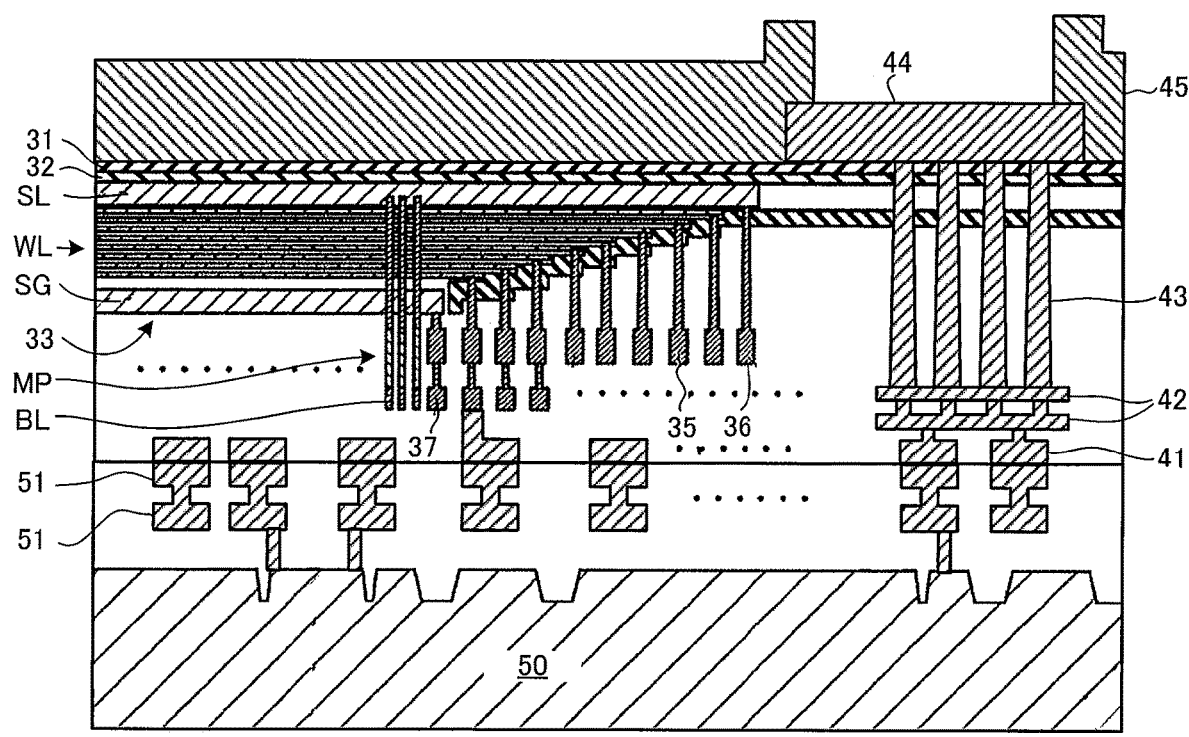
FIG. 14 is a sectional view schematically showing one example of a semiconductor device.

FIG. 4 is a flowchart showing a process of the method. FIG. 5 to FIG. 11 show states of the apparatus at this time. FIG. 12 to FIG. 14 show examples of the semiconductor wafers Wa, Wb and the manufactured semiconductor device.

FIG. 12 to FIG. 14 concretely show the examples in which the semiconductor wafers Wa, Wb being an array wafer and a control circuit wafer respectively are bonded to each other. Here, the semiconductor wafers Wa, Wb are explained as an array chip and a control circuit chip respectively because they are separated into pieces of chips after being bonded to each other. The array chip includes a plurality of memory cells. The control circuit chip includes a control circuit which controls writing, erasing, and reading of data with respect to the memory cells. Bonding between the array chip and the control circuit chip can form a nonvolatile semiconductor memory which can erase and write the data and retain memory contents even though power supply is cut.

The array chip includes a substrate 30, insulation films 31, 32, a source line SL, and a memory cell array 33, each being stacked in that order. The memory cell array 33 has a stack in which electrode layers WL and insulation layers are alternately stacked, a select gate SG, and a memory pillar MP.

A bit line BL, a word wiring layer 35, a source wiring layer 36, and a select gate wiring layer 37 are connected to the memory cell array 33.

The bit line BL, the word wiring layer 35, the source wiring layer 36, and the select gate wiring layer 37 are connected to a surface wiring layer 41 with other plug and wiring layer interposed therebetween.

The surface wiring layer 41 is connected to pads 42 and an external connection electrode 43.

The control circuit chip has a substrate 50 in which various control circuits are formed and circuit-side wiring layers 51.

The semiconductor device is fabricated by removing the substrate 30 and adding an external connection electrode 44 and a protective layer 45 as described later after bonding the array chip and the control circuit chip.

Hereinafter, details of the process of the method are explained.

Figure 5:
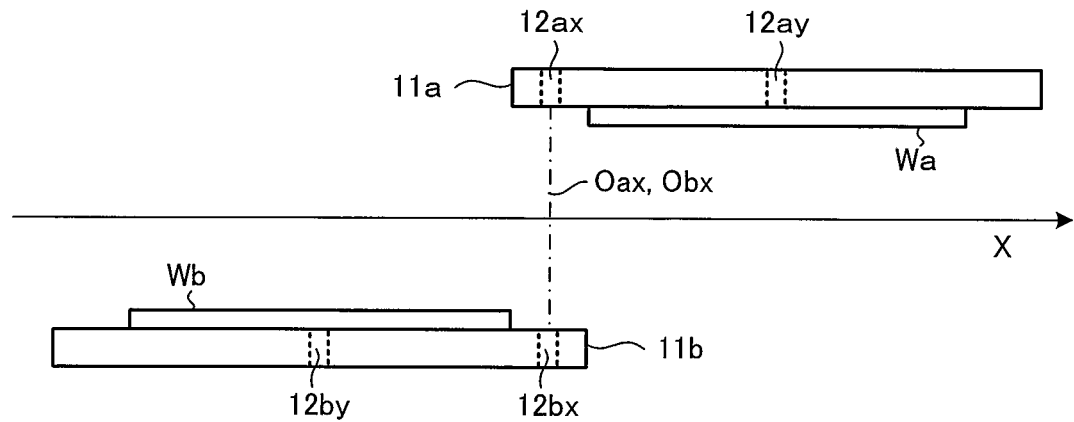
FIG. 5 is a schematic diagram showing the stages during the manufacturing process of the semiconductor device.

(1) Load of Semiconductor Wafers Wa, Wb (Step S11 and FIG. 5, FIG. 12, FIG. 13)

The semiconductor wafers Wa, Wb are loaded on the stages 11a, 11b. The loaders 14a, 14b put the semiconductor wafers Wa, Wb on the bottom surface of the stage 11a, and on the top surface of the stage 11b respectively. The put semiconductor wafers Wa, Wb are sucked and fixed on the stages 11a, 11b.

Hereinafter, in each of the X-axis and Y-axis directions, the axis alignment of the detectors 12 (Step S12) to the positioning of the semiconductor wafers Wa, Wb (Step S15) are performed in that order. Here, an explanation is made on condition that the positionings are performed in order of the X-axis direction and the Y-axis direction. However, this order can be inverted.

(2) Axis Alignment of Detectors 12 (Step S12 and FIG. 5)

The axes of the detectors 12ax, 12bx are aligned. That is, the stages 11a, 11b are moved relatively to each other in the X-axis direction to allow the detectors 12ax, 12bx to detect (photograph) each other. Thereafter, the detectors 12ax, 12bx detect each other, and adjust their respective positions so that their axes Oax, Obx correspond to each other.

The center axes Oax, Obx need not be completely matched with each other. Even though the center axes Oax, Obx somewhat deviate from each other, there is no inadequacy as long as the deviation amount (offset) becomes clear.

Figure 6:
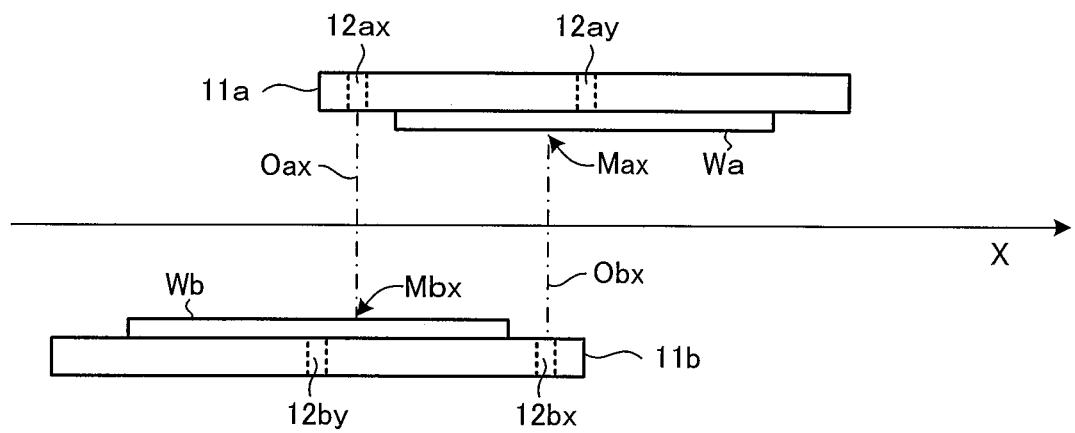
FIG. 6 is a schematic diagram showing the stages during the manufacturing process of the semiconductor device.
Figure 7:
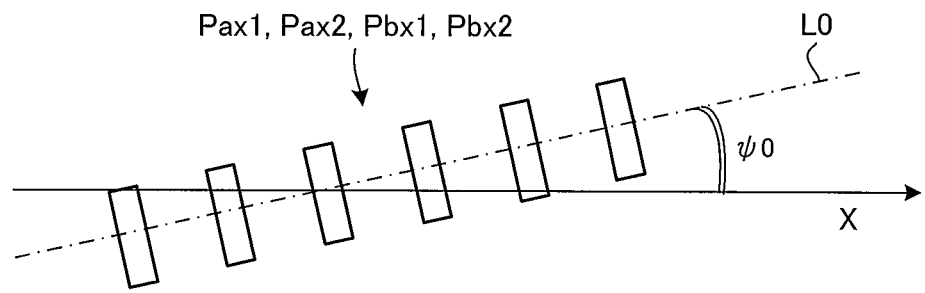
FIG. 7 is a schematic diagram showing one example of inclination detection in accordance with patterns P.

(3) Detection of Alignment Marks M (Step S13 and FIG. 6, FIG. 7)

The stage 11a is scanned (here, movement in the X-axis direction over a distance Xoff), to cause the axis Oax of the detector 12ax to be in the vicinity of the coordinate at which the alignment mark Mb of the semiconductor wafer Wb is disposed. At this time, the position deviation between the wafers Wa, Wb is ignored.

By detecting a direction L0 in which the patterns Pax1, Pax2 are lined up, calculating a deviation from the orientation in the X-axis direction (angle $\varphi 0$), and rotating the semiconductor wafer Wa around the Z axis, a correction is made so that the direction L0 is along the X-axis direction. Similarly, a direction L0 in which the patterns Pbx1, Pbx2 are lined up is detected, and the semiconductor wafer Wb is rotated so that the direction L0 is along the X-axis direction.

The alignment marks Mb, Ma are read by the detectors 12ax, 12bx. This reading need not be performed at the same time, but during the reading of the alignment marks Mb, Ma, it is preferable that the stages 11 need not be moved. During the reading of the two alignment marks, the movement of the stages 11 causes a possibility of changing an offset amount.

(4) Calculation of Position Deviation Dx of Semiconductor Wafers Wa, Wb (Step S14 and FIG. 8)

Distances Xa, Xb from the X coordinates Obx, Oax of the center axes of the detectors 12 to the alignment positions Tax, Tbx are respectively calculated. At this time, in accordance with a difference in periodicity of the pitches of the patterns Pax1, Pax2 and the patterns Pbx1, Pbx2, the positions Tax, Tbx at each of which lines correspond to each other are calculated.

Here, the detectors 12ax, 12bx detect the alignment marks Mb, Ma in detection ranges (fields of view) Aax, Abx respectively. That is, the alignment positions Tax, Tbx deviate from the detection ranges (fields of view) Abx, Aax. Even in this case, it is possible to determine the alignment positions Tax, Tbx.

The controller 16 determines the alignment positions Tax, Tbx, for example, as follows.

1) Disposition of Lines of Patterns Pax1, and Determination of Pitch

Its center is determined for each line of the patterns Pax1 by image processing. For example, by adding X coordinates of pixels composing the line and dividing the added value by the number of the pixels, an X coordinate of the center of each line is found. By performing this processing for each line, an X coordinate of the center of each line is found. Finding a difference (pitch) in a row of the X coordinates makes it possible to extrapolate a disposition of lines out of the field of view.

2) Disposition of Lines of Patterns Pax2, and Determination of Pitch

A disposition of the centers of the lines in the X-coordinate direction can also be found similarly in the patterns Pax2.

3) Calculation of Alignment Positions Tax, Tbx

An X coordinate at which the centers of the lines of the patterns Pax1 and the patterns Pax2 come the closest to each other corresponds to the alignment position Tax.

The above indicates the process of finding the alignment position Tax, and the alignment position Tbx can also be found by a similar process.

4) Calculation of Distances Xa, Xb

The distances Xa, Xb from the respective center axes (reference of X axis: origin) Obx, Oax of the detectors 12 to the alignment positions Tax, Tbx are calculated.

5) Calculation of Position Deviation Dx of Semiconductor Wafers Wa, Wb

Since the axis alignment is performed on the detectors 12, the distance (relative movement amount of the first stage) Xoff over which the stage 11 (wafer Wa) is moved relatively to each other in the X-axis direction thereafter (in Step S13) is a distance between the axes Oax and Obx.

As a result, the deviation Dx in the X-axis direction between the semiconductor wafers Wa and Wb can be calculated by the following formula (1).

$$Dx = Xa + Xb + Xoff \qquad \text{formula (1)}$$

Figure 9:
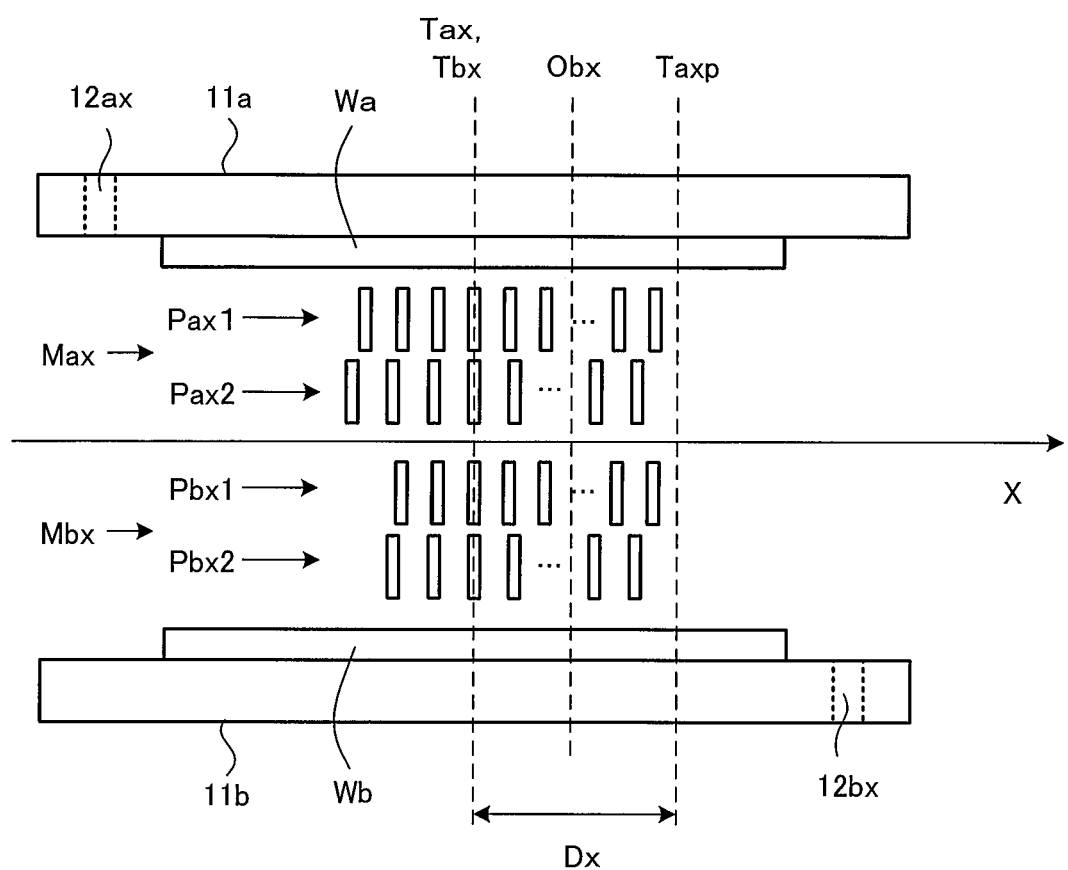
FIG. 9 is a schematic diagram showing one example of positioning of the semi conductor wafers.

(5) Positioning of Semiconductor Wafers Wa, Wb (Step S15 and FIG. 9)

The stage 11a is moved in the X-axis direction over the distance Dx to perform the positioning of the semiconductor wafers Wa, Wb in the X-axis direction.

That is, the alignment positions Tax, Tbx are matched with each other. This also means that the alignment marks Ma, Mb overlap each other.

An alignment position Taxp is the alignment position Tax before moving the stage 11a in Step S15.

(6) Judgment of Positioning Completion of X, Y (Step S16)

The above indicates the positioning in the X-axis direction. The process of Steps S12 to S15 is also performed similarly in the Y-axis direction.

Thus, the positionings of the semiconductor wafers Wa, Wb in both the X-axis and Y-axis directions are completed.

(7) Bonding of Semiconductor Wafers Wa, Wb (Step S17 and FIG. 14)

After completing the positioning of the semiconductor wafers Wa, Wb, the semiconductor wafers Wa, Wb are bonded to each other. Here, in a state of bringing surfaces of the semiconductor wafers Wa, Wb into contact with each other, the semiconductor wafers Wa, Wb are heated to bond the surface wiring layers 41 and the circuit-side wiring layers 51.

After bonding the semiconductor wafers Wa, Wb being the array wafer and the control circuit wafer respectively, the substrate 30 is removed, and the external connection electrode 44 and the protective layer 45 are formed. Thereafter, a semiconductor wafer-bonded body is subjected to dicing to be separated into pieces of chips.

Figure 10:
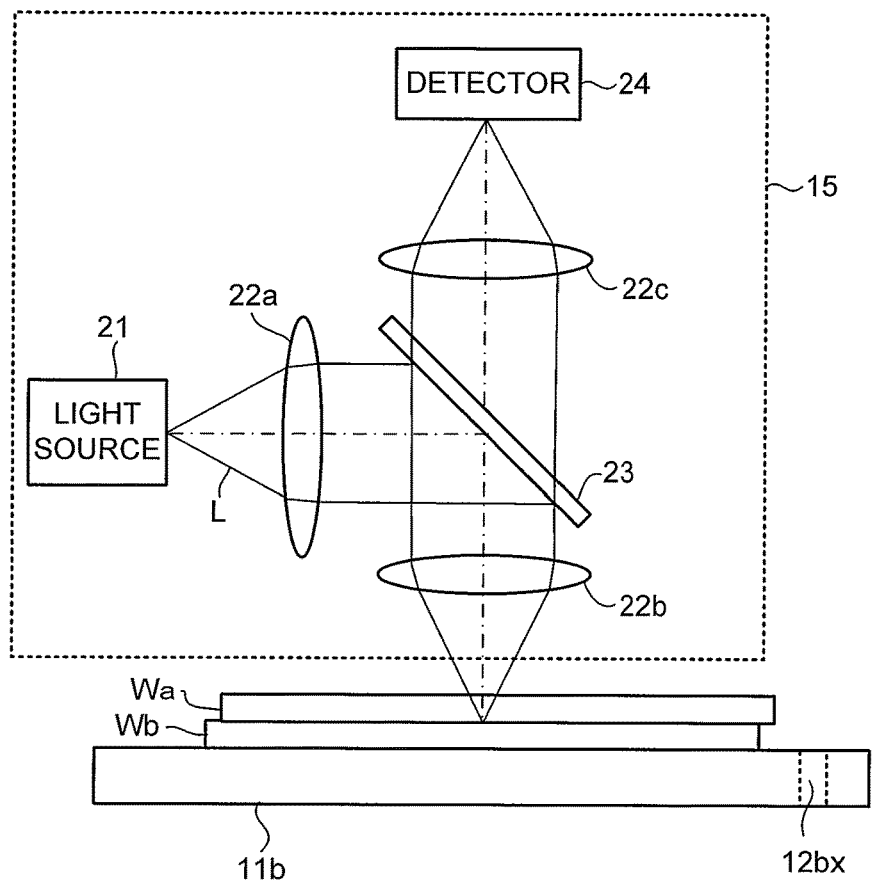
FIG. 10 is a block diagram showing a configuration example of an overlay measurement instrument.
Figure 11:
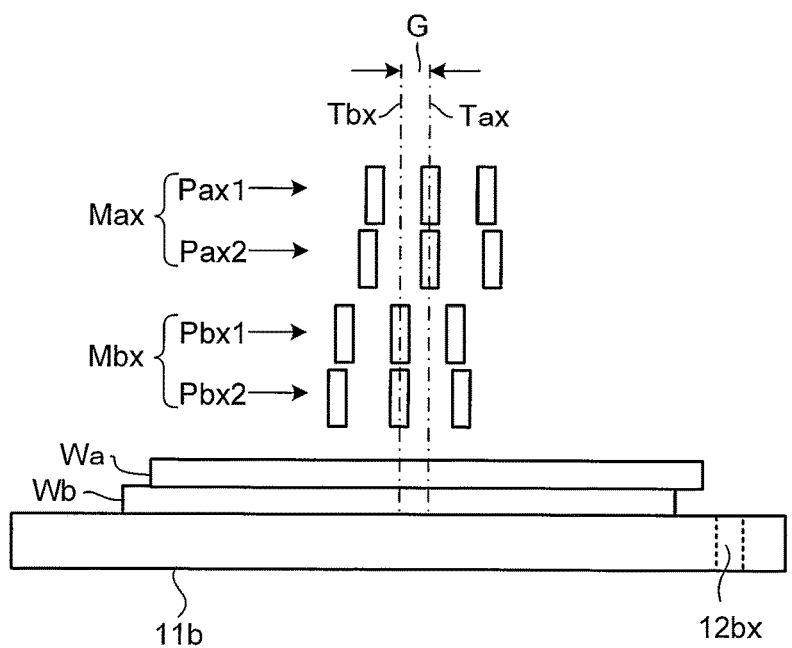
FIG. 11 is a schematic diagram showing one example of overlay measurement.

(8) Measurement of Overlay (Step S18 and FIG. 10, FIG. 11)

After bonding the semiconductor wafers Wa, Wb, before the above processing (for example, before removing the substrate 30), overlay measurement is performed by the overlay measurement unit 15. For this measurement, the alignment marks Ma, Mb are used.

FIG. 10 is a schematic diagram showing a configuration example of the overlay measurement unit 15. The overlay measurement unit 15 has a light source 21, lenses 22a to 22c, a half mirror 23, and a detector 24.

The light source 21 emits, for example, near-infrared light. The near-infrared light can be transmitted by the semiconductor wafers Wa, Wb each made of a semiconductor (for example, silicon).

The lenses 22a to 22c convert convergent light into collimated light, or the collimated light into the convergent light.

The half mirror 23 is a reflector plate which reflects a part of incident light and transmits a part thereof.

The detector 24 is, for example, an optical imaging device (as one example, CCD: Charge Coupled Device) which photographs an image of the incident light.

The light emitted from the light source 21 is converted into the collimated light by the lens 22a, reflected by the half mirror 23, and converged by the lens 22b to be incident on the semiconductor wafers Wa, Wb. This incident light is reflected at the boundary between the semiconductor wafers Wa and Wb and passes through the lens 22b, the half mirror 23, and the lens 22c, and images are focused on the detector 24.

As a result, the detector 24 can measure a deviation G of the alignment positions Tax, Tbx of the marks Max, Mbx of the alignment marks Ma, Mb of the semiconductor wafers Wa, Wb (a position deviation between the semiconductor wafers Wa, Wb) (refer to FIG. 11). That is, it is possible to confirm whether or not the position deviation between the semiconductor wafers Wa, Wb after bonding the semiconductor wafers is within an allowable range.

Here, the position deviation in the X-axis direction is measured using the marks Max, Mbx, and the position deviation in the Y-axis direction can be measured using the marks May, Mby.

As described above, this embodiment does not require the movement of the stages and the acquisition of the image corresponding to each of the alignment marks Ma, Mb, and makes it possible to acquire the images of the alignment marks Ma, Mb practically at the same time. This enables efficient alignment of the wafers Wa, Wb.

Further, the alignment positions Tax, Tbx can also be found from virtual images of parts of the alignment marks Ma, Mb, and this point also contributes to the efficient alignment.

While certain embodiments of the present invention have been described, these embodiments have been presented by way of example only, and are not intended to limit the scope of the inventions. Indeed, the novel embodiments described herein can be embodied in a variety of other forms; furthermore, various omissions, substitutions and changes in the form of the embodiments described herein can be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
   loading a first semiconductor substrate having a first alignment mark onto a first stage, and loading a second semiconductor substrate having a second alignment mark onto a second stage;
   detecting the second alignment mark by a first detector on the first stage, and detecting the first alignment mark by a second detector on the second stage;
   aligning positions of the first and second semiconductor substrates in accordance with results of the detections; and
   bonding the first and second semiconductor substrates,
   wherein the first alignment mark has:
      a first patterns arranged at a first pitch; and
      a second patterns arranged at a second pitch different from the first pitch, and
   wherein the second alignment mark has:
      a third patterns arranged at a third pitch; and
      a fourth patterns arranged at a fourth pitch different from the third pitch.

2. The method according to claim 1,
   wherein the first patterns and the second patterns are arranged in parallel.

3. The method according to claim 1,
   wherein the alignment of the positions includes:
      calculating a first position where any of the first patterns and any of the second patterns correspond to each other, and calculating a second position where any of the third patterns and any of the fourth patterns correspond to each other; and
      calculating a position deviation between the first and second semiconductor substrates in accordance with the first and second positions.

4. The method according to claim 3,
   wherein one of the first patterns and one of the second patterns are arranged in line at the first position, and
   wherein one of the third patterns and one of the fourth patterns are arranged in line at the second position.

5. The method according to claim 1,
   wherein the detection of the first alignment mark includes rotating the first semiconductor substrate in accordance with an inclination of the first or second pattern.

6. The method according to claim 1, further comprising:
   aligning an axis of the first detector and an axis of the second detector before the detections of the first and second alignment marks.

7. The method according to claim 6, further comprising:
   after the alignment of the axes of the first and second detectors, relatively moving the first stage to a position on which the first detector detects the second alignment mark and the second detector detects the first alignment mark.

8. The method according to claim 7, further comprising calculating a position deviation between the first and second semiconductor substrates in accordance with the results and the relative movement amount of the first stage,
   wherein the positions are aligned in accordance with the position deviation.

9. The method according to claim 1, further comprising detecting the first and second alignment marks by a third detector to perform overlay measurement after bonding the first and second semiconductor substrates.

10. A method of manufacturing a semiconductor device, comprising:
    loading a first semiconductor substrate having a first alignment mark onto a first stage, and loading a second semiconductor substrate having a second alignment mark onto a second stage;
    detecting the second alignment mark by a first detector on the first stage, and detecting the first alignment mark by a second detector on the second stage;

aligning positions of the first and second semiconductor substrates in accordance with results of the detections;

bonding the first and second semiconductor substrates; and detecting the first and second alignment marks by a third detector to perform overlay measurement after bonding the first and second semiconductor substrates.

11. The method according to claim 10, further comprising:

aligning an axis of the first detector and an axis of the second detector before the detections of the first and second alignment marks.

12. The method according to claim 10, further comprising:

after the alignment of the axes of the first and second detectors, relatively moving the first stage to a position on which the first detector detects the second alignment mark and the second detector detects the first alignment mark.

13. The method according to claim 10, further comprising calculating a position deviation between the first and second semiconductor substrates in accordance with the results and the relative movement amount of the first stage, wherein the positions are aligned in accordance with the position deviation.

* * * * *